United States Patent [19]

Miazga

[11] Patent Number: 5,117,330
[45] Date of Patent: May 26, 1992

[54] FIXTURE FOR CIRCUIT COMPONENTS

[75] Inventor: Jay M. Miazga, Marysville, Wash.

[73] Assignee: Hewlett-Packard Company, Palo Alto, Calif.

[21] Appl. No.: 507,336

[22] Filed: Apr. 9, 1990

[51] Int. Cl.⁵ .............................................. H05K 7/06
[52] U.S. Cl. ........................... 361/400; 361/417; 361/419; 361/420; 361/427; 174/138 G
[58] Field of Search ............ 361/400, 412, 417, 419, 361/420, 426, 427; 248/27.1; 174/138 G

[56] References Cited

U.S. PATENT DOCUMENTS

| | | | |
|---|---|---|---|
| 4,667,270 | 5/1987 | Yagi | 361/400 X |
| 4,728,753 | 3/1988 | Nakano | 361/403 X |
| 4,951,176 | 8/1990 | Bergfried et al. | 361/400 |

Primary Examiner—Leo P. Picard
Assistant Examiner—Paramita Ghosh

[57] ABSTRACT

A fixture (20) for fixing the position of a circuit component (22) relative to a circuit board (28). The fixture includes a spacer (40) that has contact surfaces (50) that bear upon a surface (26) of the board (28). The spacer (40) also includes support surfaces (56) upon which a dual in-line packaged component (22) rests. The distance between the contact surfaces (50) and support surfaces (56) are established to precisely locate a surface (60) of the component relative to the surface (26) of the board (28). Also included are clip mechanisms (42, 44) for securing the spacer (40) to the board (28) and for securing the component (22) to the spacer (40).

3 Claims, 2 Drawing Sheets

FIXTURE FOR CIRCUIT COMPONENTS

TECHNICAL FIELD

This invention pertains to mechanisms for attaching electronic circuit components to a circuit board.

BACKGROUND INFORMATION

Fabrication of electronic instruments typically involves attaching discrete electronic components to a printed circuit board. Electronic instruments that incorporate alpha-numeric displays typically employ discrete circuit components known as 7-segment light-emitting diodes (LEDs). Such components are available in a configuration known as a dual in-line package (DIP). A DIP configuration generally comprises a molded plastic housing from beneath which depend two parallel rows of spaced apart leads. The ends of the leads are inserted into corresponding sockets formed in a printed circuit board. The inserted leads are soldered within the sockets. As used herein, the acronym LED will refer to LED's that are available in a DIP configuration.

The upper surface of an LED defines a viewing surface from which emanates the light generated by the LED. For many applications, the LED must be attached to the circuit board so that the viewing surface of the LED is precisely positioned relative to the board. For instance, some electronic instruments include transparent cover plates that cover the viewing surface of the LED. The appearance of the instrument display is clearest where the inner surface of the transparent cover plate of the instrument is mounted close to and parallel with the viewing surface of the LED. To establish and maintain this close relationship between the LED viewing surface and the instrument cover plate, some mechanism must be employed for holding the LED in precise position relative to the circuit board before and after the leads are soldered into the sockets.

SUMMARY OF THE INVENTION

The present invention provides a fixture for holding an electronic circuit component, such as an LED, in precise position relative to a circuit board as the component is attached to the board.

The fixture is a unitary article that incorporates a spacer for establishing a predetermined registration distance between the surface of the printed circuit board and the viewing surface of an LED. To this end, the spacer includes coplanar contact surfaces that contact the upper surface of the board and coplanar support surfaces for supporting the circuit component. The distance between the contact surfaces and the support surfaces is precisely defined when the fixture is made.

A lower clip mechanism is attached to the spacer and used for securing the spacer to the board with the spacer contact surfaces pressed against the surface of the board. An upper clip mechanism is attached to the spacer and used for securing the circuit component against the spacer support surfaces.

The lower clip mechanism includes resilient legs that deflect to engage apertures formed in the board. The legs continuously urge together the board surface and the contact surfaces of the spacer.

The upper clip mechanism includes resilient arms that deflect to engage the molded body of the component. The arms continuously urge together the molded body and the support surfaces of the spacer.

As another aspect of this invention, the upper clip mechanism is configured so that it can be readily detached from the fixture after the circuit component is attached to the board. Detachment of the upper clip mechanism removes protrusions from the fixture, thereby permitting a transparent cover sheet of an electronic instrument to be located very close to the viewing surface of the LED.

DETAILED DESCRIPTION OF THE PREFERRED EMBODIMENT

Figure 1:
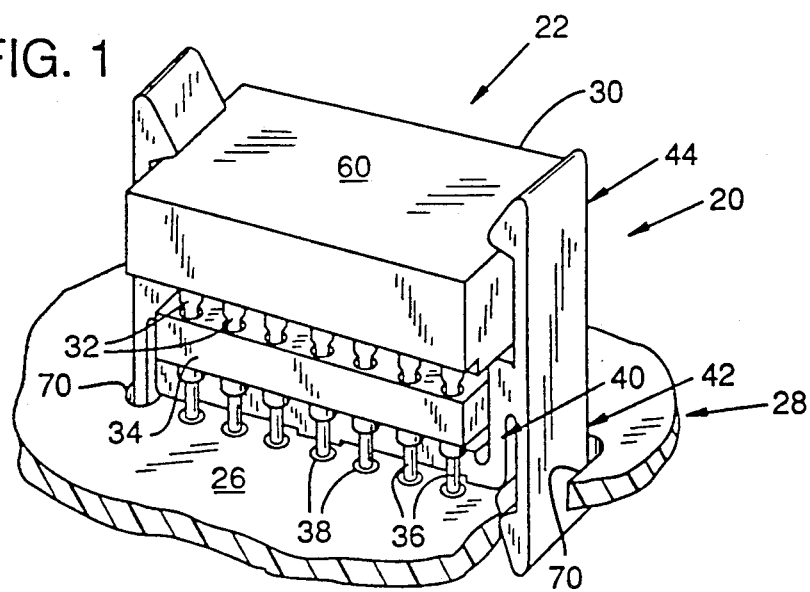
FIG. 1 is a perspective view of a fixture formed in accordance with the present invention showing the fixture mounted to a circuit board and engaging an electronic component.

With reference to FIGS. 1-4, the fixture 20 of the present invention is employed for fixing the position of an electronic component 22 relative to the upper or mounting surface 26 of a printed circuit board 28. In the embodiment shown, the electronic component 22 is a dual in-line packaged 7-segment light-emitting diode (LED) having a rigid molded body 30 and two rows of downwardly depending leads 32.

In the embodiment shown, a conventional DIP socket assembly 34 is located between the circuit board 28 and LED 22 to receive the leads 32 of the LED 22. The downwardly depending pins 36 of the socket assembly 34 engage the conductive sockets 38 formed in the circuit board 28. It will become clear upon reading this description that the fixture 20 of the present invention may be adapted to precisely position any of a number of DIP components, with or without use of a socket assembly.

The fixture 20 is preferably formed of injection-molded plastic. The fixture comprises a spacer 40 for establishing a precise position of the LED 22 relative to the board 28, a lower clip mechanism 42 for securing the spacer 40 to the board 28, and an upper clip mechanism 44 for securing the LED 22 to the spacer 40 (FIG. 1). The LED 22 (or, as in the illustrated embodiment, the socket assembly 34) is then soldered in place while the LED is carried on the fixture 20.

Turning to the particulars of the construction of the fixture 20, the spacer 40 includes a base 46 that rests upon the mounting surface 26 of the printed circuit board 28. The base 46 is sized to fit between the two parallel rows of sockets 38 that are formed in the board 28 at the location where the LED 22 is to be plugged into the circuit carried by the board.

The underside of the base 46 includes downwardly depending feet 48. The feet 48 have flat contact surfaces 50 that are coplanar and that rest upon the mounting surface 26 of the circuit board 28. In the preferred embodiment, three feet 48 are employed, one extending across the width of the base 46 at the center thereof, and two others extending across the width of the base 46 at each end thereof. More or fewer feet may be employed.

It is important, however, that the contact surfaces 50 of the feet 48 be smooth and, preferably, coplanar so that the base 46 rests firmly against the mounting surface 26 of the board 28.

In the preferred embodiment, the injection-molded fixture 20 is constructed so that the contact surfaces 50 do not include any inclination or "draft" for facilitating removal of the fixture from its mold. Moreover, it is preferred that the mold be constructed with a gate that is located in a surface (such as surface 52 in FIG. 4) where the roughness of the surface 52 attributable to the gate will not affect the smoothness of the contact surfaces 50, or other surfaces (as will be described) that are employed for positioning the spacer 40 and the LED 22.

Figure 2:
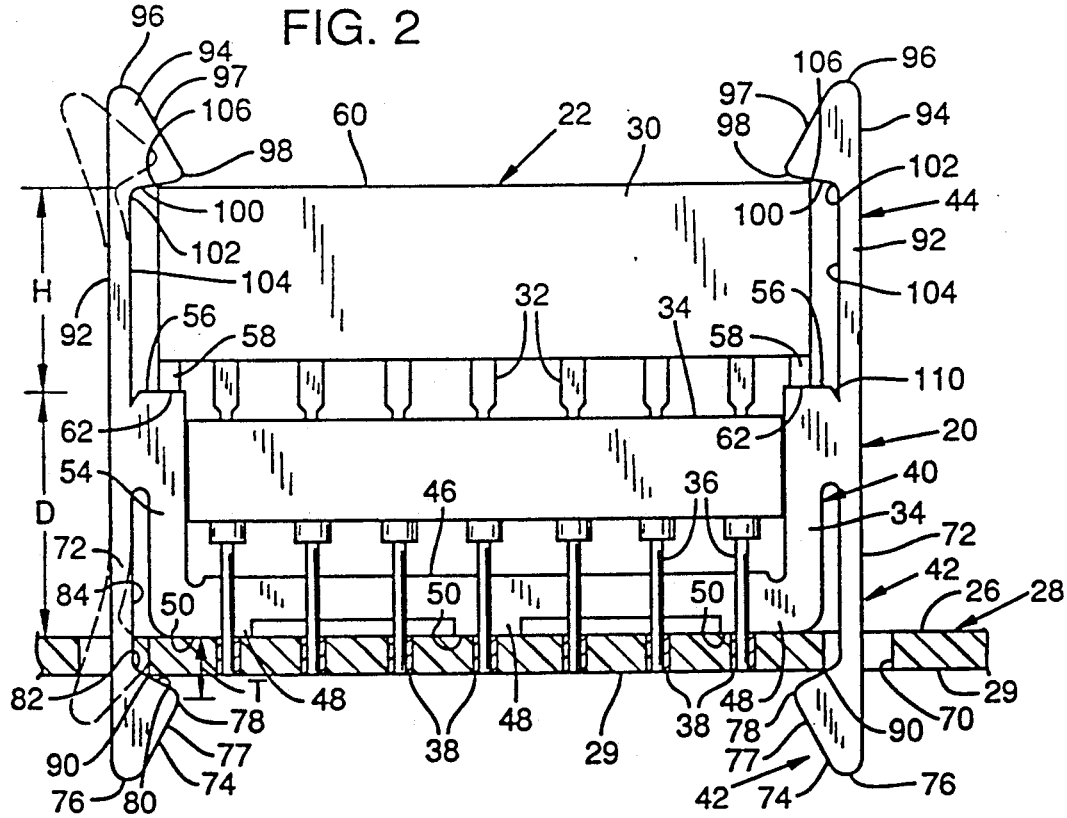
FIG. 2 is a side elevation view of the fixture.
Figure 3:
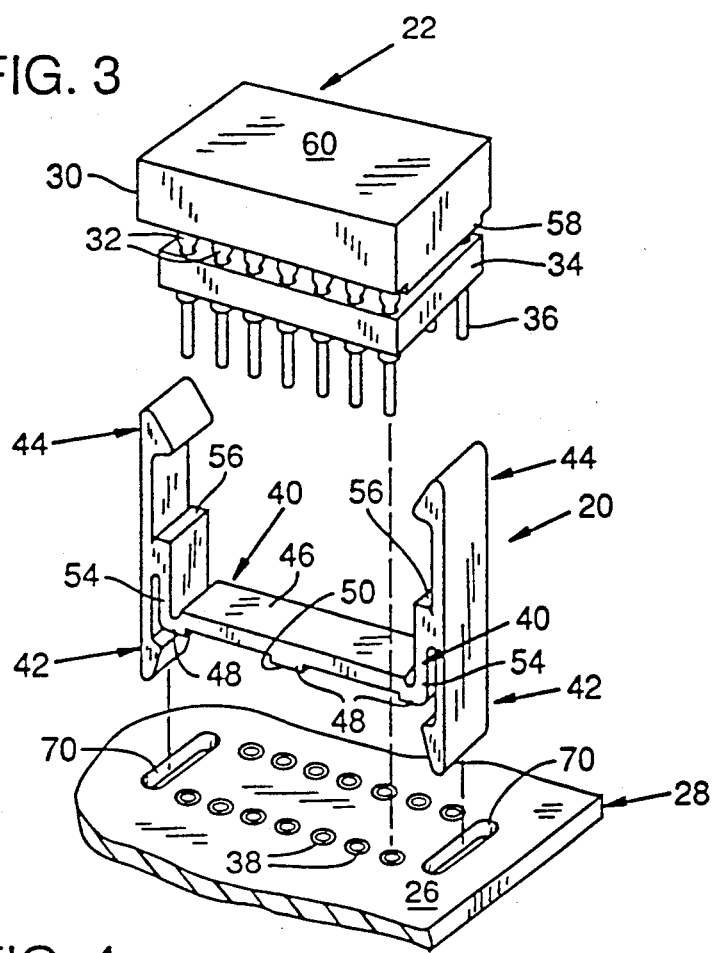
FIG. 3 is an exploded perspective view showing the fixture, circuit board, and electronic component.

A sidewall 54 extends upwardly from each end of the spacer base 46. The upper end of each sidewall 54 has a flat support surface 56. Preferably, the support surfaces 56 of the sidewalls 54 are coplanar and spaced a uniform distance D from the contact surfaces 50 of the base feet 48. The support surfaces 56 support the molded body 30 of the LED 22. In this regard, each end of the LED body 30 includes a downwardly depending lip 58 that rests upon an associated support surface 56. As best shown in FIG. 2 the molded body 30 of a conventional LED is constructed so that the viewing surface 60 of the LED is precisely established at a uniform distance H from the underside 62 of each lip 58.

It is noteworthy that the spacer 40 does not support the LED 22 by contact with the leads 32 of the LED. Accordingly, the position of the LED relative to the spacer 40 is not influenced by any variations that may occur in the shape of the leads.

Figure 4:
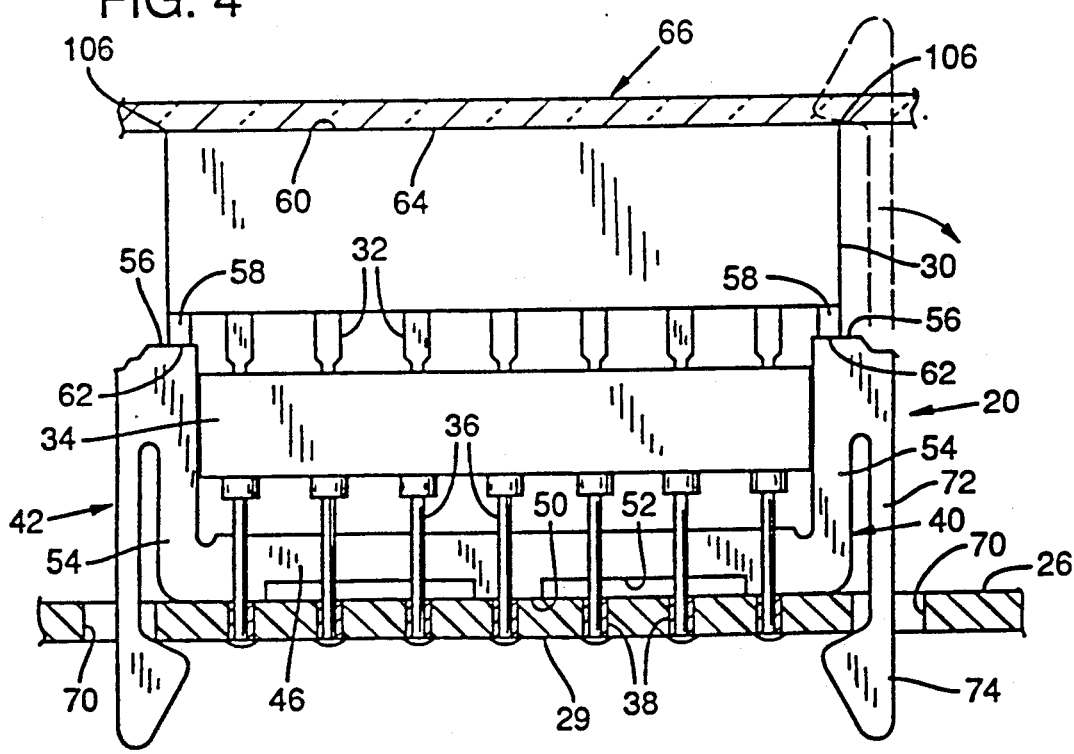
FIG. 4 is a side elevation view of the fixture illustrating the detachment of the upper clip mechanism to permit a cover plate to be placed adjacent to the viewing surface of the electronic component.

In view of the above, it can be appreciated that the spacer 40 may be constructed so that the distance D is established at a length necessary for securing the LED 22 so that the viewing surface 60 is positioned at a precise predetermined distance (H+D) (hereafter referred to as the registration distance) above the board surface 26. As noted earlier, for many applications the registration distance (H+D) will correspond to the distance between the board surface 26 and the undersurface 64 of a transparent cover plate 66 that is mounted to extend over the viewing surface 60 of the LED 22 (FIG. 4). The registration distance (H+D) may be great enough to warrant the use of the socket assembly 34 interconnected between the LED 22 and the circuit board 28. In such a situation, it is noteworthy that the socket assembly 34 does not bear upon any surface of the fixture 20. Accordingly the distance D is unaffected by variations that may occur in the depth of insertion of the LED leads 32 within the socket assembly 34, or by variations in the depth of insertion of the socket assembly pins 36 into the board sockets 38.

The lower clip mechanism 42 secures the spacer 40 to the board 28 so that the contact surfaces 50 of the feet 48 will not move away from the surface 26 of the board. The lower clip mechanism 42 engages elongated slots 70 that are formed through the board 28, one slot being near each end of the two parallel rows of board sockets 38.

The lower clip mechanism 42 includes two legs 72 that are integrally formed with the spacer sidewalls 54. Each leg 72 is attached at one end near the upper end of a sidewall 54 and extends downwardly therefrom near the sidewall 54 to terminate in a tip 74. The tip 74 of each leg 72 includes a rounded lower edge 76 above which the tip 74 gradually increases in cross-sectional width (FIG. 2) in the direction toward the other tip 74.

The tip 74 is widest at an inner edge 78, which is located a distance T from the plane of the spacer contacting surfaces 50. The distance T is greater than the thickness of the board 28.

Above the inner edge 78 of each tip 74 the crosssectional width of the tip 74 decreases to define a generally flat, smooth clamping surface 80 between the inner edge 78 and the inside corner 82 that is defined where the clamping surface 80 meets the generally vertical inside flat surface 84 of the legs 72.

The tips 74 of the legs 72 are spaced so that they deflect apart (dashed lines in FIG. 2) to fit through the associated slots 70 in the board 28. In this regard, each tip 74 includes an inclined surface 77 between the lower edge 76 and inner edge 78. The inclined surface slides against the edge of the slot 70 to deflect the tip 74 as the fixture is pushed downwardly against the board 28. Moreover, the fixture legs 72 are spaced apart a distance such that the tips 74 are continuously urged by the intrinsic resilience of the fixture material against the lower inside edge 90 of the slot 70 through which the tip extends. Moreover, the inclination of the clamping surface 80 is such that the direction of force applied by the tip 74 has the effect of pressing the contact surfaces 50 firmly against the board surface 26.

The upper clip mechanism 44 secures the molded body 30 of the LED 22 to the support surfaces 56 of the sidewalls 54. The upper clip mechanism 44 includes two arms 92 that are integrally formed with the spacer sidewalls 54. Each arm 92 is attached at one end near the upper end of the sidewall 54 and extends upwardly therefrom to terminate in a head 94. The head 94 of each arm 92 includes a rounded upper edge 96 beneath which the cross-sectional width (FIG. 2) of the head 94 gradually increases in the direction toward the other head 94.

The head 94 is widest at an inner edge 98, which is located a distance from the supporting surface 56 that is slightly greater than the distance H mentioned above. Beneath the inner edge 98 of the head 94, the crosssectional width of the head 94 decreases to define a generally flat, smooth clamping surface 100 between the inner edge 98 and the inside corner 102 that is defined where the clamping surface 100 meets the generally vertical inside surface 104 of the arm 92.

The heads 94 of the arms 92 are spaced so that they deflect apart (dashed lines in FIG. 2) so that the molded body 30 of the LED 22 may be inserted downwardly between the heads 94 until the lips 58 of the LED 22 rest upon the support surfaces 56 of the spacer sidewalls 54. As the LED 22 is inserted downwardly between the heads 94, the lips 58 of the LED engage the inclined surfaces 97 between the upper edge 96 and inner edge 98 of each head 94. The inclined surfaces 97 slide against the lips 58 to deflect the heads 94 as mentioned earlier.

The fixture arms 92 are spaced apart a distance such that the heads 94 of the upper clip mechanism are continuously urged by the intrinsic resilience of the fixture material against the edges 106 of the viewing surface 60 of the LED 22. Moreover, the inclination of the clamping surfaces 100 is such that the direction of force applied by the heads 94 has the effect of pressing the lips 58 of the LED body 30 against the support surfaces 56 of the spacer 40.

In the preferred embodiment, the injection-molded fixture 20 is constructed so that the support surfaces 56, and clamping surfaces 80 and 100 do not include any draft for facilitating removal of the fixture from its mold.

With the spacer 40 and LED 22 clipped in place (FIG. 2) as just described, the board sockets 38 and socket assembly pins 36 are soldered together by known means. For instance, the board may be exposed to molten solder that flows into the sockets 38 from the undersurface 29 of the board 28. It is noteworthy that the clip mechanisms 42, 44 just described will resist the upward buoyant force upon the socket assembly 34 that is generated as the solder flows into the sockets 38. Accordingly, the contact surfaces 50 of the spacer will remain against the upper surface 26 of the board so that the registration distance (H+D) is unchanged.

After the socket assembly 34 (or, alternatively, the LED 22) is soldered in place, the arms 92 of the fixture are detached so that the heads 94 will not interfere with the close placement of the cover plate undersurface 64 against the viewing surface 60 of the LED (see FIG. 4). To this end, a V-shaped groove 110 is formed to the fixture at the base of each arm 92 where the arm joins the sidewall 54. The groove 110 generates a stress riser whenever the heads 94 are forced apart. Consequently, as the heads are forced a sufficient distance apart, the arms 92 readily break from the fixture (see FIG. 4).

In the preferred embodiment, the fixture is a composite of nylon with 30% fiberglass by weight. This composition provides the resilience necessary for proper performance of the clip mechanisms 42, 44 yet allows the arms 92 to be easily severed from the fixture as just described. The nylon/fiberglass composition is also advantageous in that it provides a clip mechanism 44 that is able to withstand without substantial deformation the elevated temperature of the molten solder as the socket assembly 34 is soldered in place.

While the invention has been described with respect to a preferred embodiment it is understood that the embodiment described and illustrated should be considered illustrative only and not as limiting the invention. Instead, the invention is to include all of the embodiments as may come within the scope and spirit of the following claims and equivalents thereof.

I claim:

1. An apparatus for fixing the position of a circuit component relative to a circuit board comprising:
   a spacer having a first surface and a second surface spaced a predetermined distance from the first surface;
   first clip means for securing the spacer to the circuit board with the first surface contacting the circuit board; and
   second clip means for securing a circuit component to the spacer with the second surface contacting the component, wherein the second clip means includes a pair of arms attached to the spacer, the arms being detachable from the spacer.

2. A fixture apparatus comprising:
   a spacer having a width sized to fit between spaced-apart rows of pins of a circuit component, the spacer having a foot attached thereto, the foot defining a first contact surface, the spacer including second contact surfaces formed thereon and spaced from the first contact surface;
   a pair of legs attached to the spacer to extend therefrom, each leg having a first clamping surface formed thereon, the legs being formed of resilient material and arranged so that part of a circuit board may be clamped between the first clamping surfaces and the first contact surface; and
   clip means for securing the circuit component to the spacer, the clip means comprising a pair of arms attached to the spacer to extend therefrom, each arm having a second clamping surface formed thereon, the arms being formed of resilient material and arranged so that a part of a circuit component may be clamped between the second clamping surfaces and the second contact surfaces, each arm including a groove formed therein to facilitate removal of the arm from the spacer.

3. The apparatus of claim 1 wherein each of the pair of arms includes a groove formed therein to facilitate detachment of the arm from the spacer.

* * * * *